(12) United States Patent
Jian

(10) Patent No.: US 12,261,601 B2
(45) Date of Patent: Mar. 25, 2025

(54) SIZE SETTING METHOD FOR POWER SWITCH TRANSISTOR AND SYSTEM THEREOF

(71) Applicant: CHINGIS TECHNOLOGY CORPORATION, Hsinchu (TW)

(72) Inventor: Shuenrun Seara Jian, Milpitas, CA (US)

(73) Assignee: CHINGIS TECHNOLOGY CORPORATION, Hsinchu (TW)

( * ) Notice: Subject to any disclaimer, the term of this patent is extended or adjusted under 35 U.S.C. 154(b) by 530 days.

(21) Appl. No.: 17/676,882

(22) Filed: Feb. 22, 2022

(65) Prior Publication Data

US 2023/0147226 A1    May 11, 2023

(30) Foreign Application Priority Data

Nov. 8, 2021   (TW) .................... 110141558

(51) Int. Cl.
*H03K 19/017* (2006.01)
*H03K 19/00* (2006.01)

(52) U.S. Cl.
CPC ....... *H03K 19/017* (2013.01); *H03K 19/0013* (2013.01)

(58) Field of Classification Search
CPC .......... G06F 21/79; G06F 1/26; G06F 1/3296; G06F 1/3203; G06F 1/3237; G06F 21/73; G06F 1/3243; G06F 1/3275; G06F 1/3287; G06F 3/0383; G06F 3/04897; G06F 1/206; G06F 3/167; G06F 3/011; G06F 3/017; G06F 2203/011; G06F 3/0346; G06F 1/022; G06F 1/28; G06F 1/30; G06F 1/324; G06F 13/20; G06F 21/71; G06F 21/86; G06F 2119/18; G06F 2203/012; G06F 2203/04806; G06F 2203/04808; G06F 2213/40; G06F 2221/2129; G06F 3/013; G06F 3/0304; G06F 3/04845;

(Continued)

(56) References Cited

U.S. PATENT DOCUMENTS

2009/0146734 A1*   6/2009  Fallah ................ H03K 19/0019
                                                           326/98
2010/0131263 A1*   5/2010  Angell .................... G10L 15/06
                                                           704/9

(Continued)

*Primary Examiner* — Binh C Tat
(74) *Attorney, Agent, or Firm* — McClure, Qualey & Rodack, LLP

(57) ABSTRACT

A size setting method for a power switch transistor and a system thereof are proposed. A load current extracting step is performed to extract a first load current and a second load current. A limited voltage drop calculating step is performed to calculate a limited voltage drop according to a speed proportional value, the first load current and the second load current. A standard supply current calculating step is performed to calculate a standard supply current according to the limited voltage drop. A simulated supply current calculating step is performed to calculate a simulated supply current according to the standard supply current, the limited voltage drop and a line voltage value. A size setting step is performed to compare the first load current with the simulated supply current to calculate a size parameter, and set a size of the power switch transistor according to the size parameter.

14 Claims, 4 Drawing Sheets

(58) Field of Classification Search
CPC ............. G06F 3/04847; G06F 3/04883; G06F 30/398; G06F 9/3802; G06F 1/06; G06F 1/08; G06F 1/1626; G06F 12/0866; G06F 2212/2022; G06F 3/0321; G06F 3/03545; H03K 19/0013; H03K 19/0948; H03K 19/17728; H03K 19/1776; H03K 19/018557; H03K 19/00384; H03K 19/0175; H03K 19/017
USPC .................................................. 716/132–136
See application file for complete search history.

(56) References Cited

U.S. PATENT DOCUMENTS

2018/0226930 A1\* 8/2018 Schober ................ H01L 29/772
2018/0308843 A1\* 10/2018 Schober ................ H01L 27/092

\* cited by examiner

SIZE SETTING METHOD FOR POWER SWITCH TRANSISTOR AND SYSTEM THEREOF

RELATED APPLICATIONS

This application claims priority to Taiwan Application Serial Number 110141558, filed Nov. 8, 2021, which is herein incorporated by reference.

BACKGROUND

Technical Field

The present disclosure relates o a size setting method for at least one power switch transistor and a system thereof. More particularly, the present disclosure relates to use a load current of a logic circuit to set a size of at least one power switch transistor, and the logic circuit configured with the at least one power switch transistor still maintains high-speed transmission.

Description of Related Art

In recent years, due to the increasing of electronic circuit devices integrated with semiconductor materials, the demand for low power consumption technologies has also gradually increased. One of the low power consumption technologies is to configure Multi-Threshold CMOS (MTCMOS) in a logic circuit. MTCMOS is an effective power switch control technology, which reduces the leakage current and the power consumption of the logic circuit and maintains the speed performance required by the logic circuit through appropriately alternating high-threshold voltage transistors and low-threshold voltage transistors.

However, many MTCMOSs as logic gates are often overloaded, which greatly affects the speed of the logic circuit. The main reason why the speed of the logic gate having been overloaded will slow down is that the large voltage drop at the source-drain terminals causes the gate-source voltage (Vgs) to become smaller. An effective method to solve the aforementioned situation is to configure the minimum size of MTCMOS according to a load (i.e., the logic circuit) of MTCMOS.

In view of this, how to establish a size setting method for at least one power switch transistor and a system thereof that can meet the speed required by the logic circuit are indeed highly anticipated by the public and become the goal and the direction of relevant industry efforts.

SUMMARY

According to one aspect of the present disclosure, a size setting method for at least one power switch transistor includes performing a first load current extracting step, a second load current extracting step, a limited voltage drop calculating step, a standard supply current calculating step, a simulated supply current calculating step and a size setting step. The first load current extracting step is performed to drive a processing unit to extract a first load current of a first logic circuit. The first logic circuit is connected to a power supply voltage via the at least one power switch transistor and at least one power line to generate the first load current, and the at least one power line has at least one line voltage. The second load current extracting step is performed to drive the processing unit to extract a second load current of a second logic circuit. The second logic circuit is connected to the power supply voltage to generate the second load current. The limited voltage drop calculating step is performed to drive the processing unit to set a speed proportional value and store the speed proportional value to a storage unit. The processing unit performs a voltage calculating procedure on the speed proportional value, the first load current and the second load current to calculate a limited voltage drop between the at least one power switch transistor and the first logic circuit. The standard supply current calculating step is performed to drive the processing unit to calculate a standard supply current of the at least one power switch transistor according to the limited voltage drop. The simulated supply current calculating step is performed to drive the processing unit to perform a current calculating procedure on the standard supply current, the limited voltage drop and the at least one line voltage to calculate a simulated supply current of the at least one power switch transistor. The size setting step is performed to drive the processing unit to compare the first load current with the simulated supply current to calculate a size parameter, and then set a size of the at least one power switch transistor according to the size parameter.

According to another aspect of the present disclosure, a size setting system for at least one power switch transistor includes a power supply voltage, the at least one power switch transistor, at least one power line, a first logic circuit, a second logic circuit, a storage unit and a processing unit. The at least one power switch transistor is connected to the power supply voltage. The at least one power line is connected to the at least one power switch transistor, and has at least one line voltage. The first logic circuit is connected to the at least one power line, and generates a first load current. The second logic circuit is connected to the power supply voltage, and generates a second load current. The storage unit is configured to access the at least one line voltage, a voltage calculating procedure and a current calculating procedure. The processing unit is signally connected to the storage unit and configured to implement a size setting method for the at least one power switch transistor including performing a first load current extracting step, a second load current extracting step, a limited voltage drop calculating step, a standard supply current calculating step, a simulated supply current calculating step and a size setting step. In particular, the first load current extracting step is performed to extract the first load current. The second load current extracting step is performed to extract the second load current. The limited voltage drop calculating step is performed to set a speed proportional value and store the speed proportional value to the storage unit, and then perform the voltage calculating procedure on the speed proportional value, the first load current and the second load current to calculate a limited voltage drop between the at least one power switch transistor and the first logic circuit. The standard supply current calculating step is performed to calculate a standard supply current of the at least one power switch transistor according to the limited voltage drop. The simulated supply current calculating step is performed to perform the current calculating procedure on the standard supply current, the limited voltage drop and the at least one line voltage to calculate a simulated supply current of the at least one power switch transistor. The size setting step is performed to compare the first load current with the simulated supply current to calculate a size parameter, and then set a size of the at least one power switch transistor according to the size parameter.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. in addition, the terms first, second, third, etc. are used herein to describe various elements or components, these elements or components should not be limited by these terms. Consequently, a first element or component discussed below could be termed a second element or component.

Figure 1:
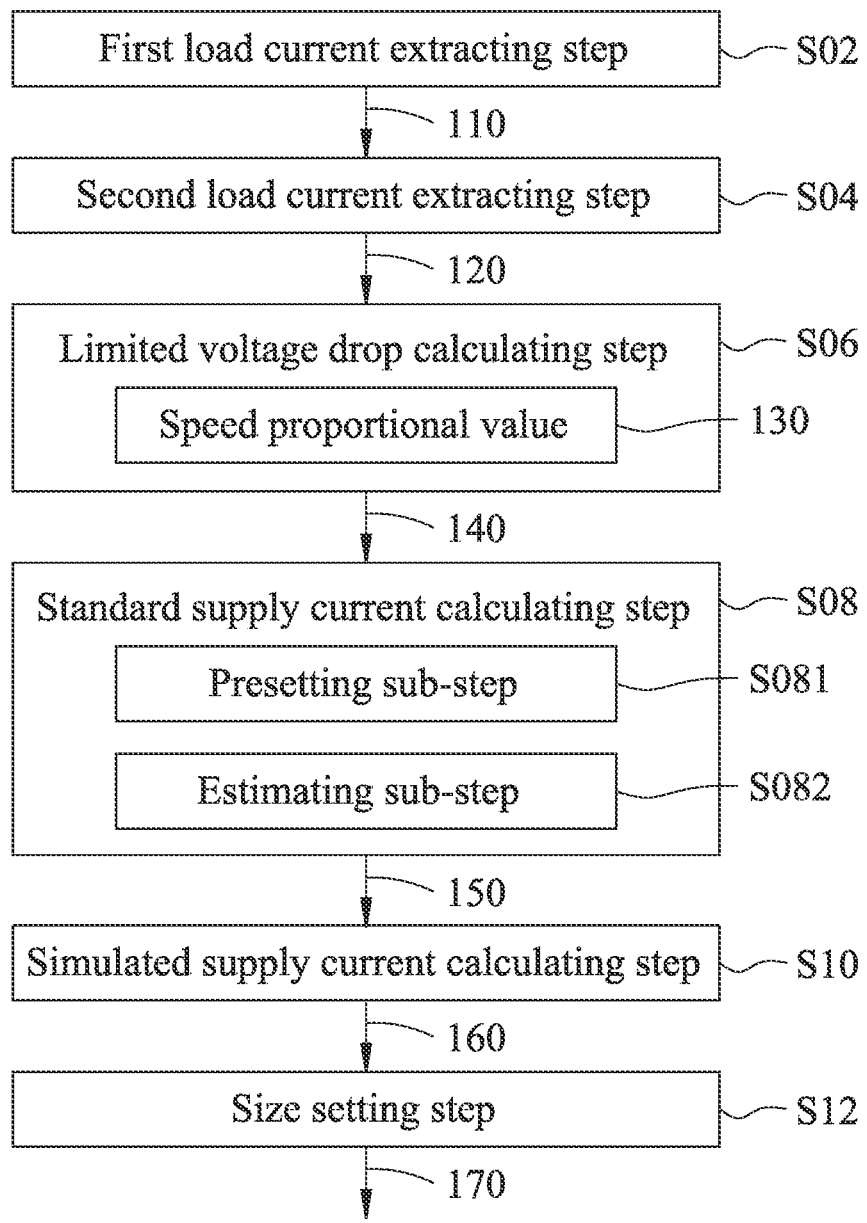
FIG. 1 shows a flow chart of a size setting method for at least one power switch transistor according to a first embodiment of the present disclosure.

Please refer to FIG. 1. FIG. 1 shows a flow chart of a size setting method 100 for at least one power switch transistor according to a first embodiment of the present disclosure. As shown in FIG. 1, the size setting method 100 for the at least one power switch transistor includes performing a first load current extracting step S02, a second load current extracting step S04, a limited voltage drop calculating step S06, a standard supply current calculating step S08, a simulated supply current calculating step S10 and a size setting step S12.

The first load current extracting step S02 is performed to drive a processing unit to extract a first load current 110 of a first logic circuit. The first logic circuit is connected to a power supply voltage via the at least one power switch transistor and at least one power line to generate the first load current 110. In addition, the at least one power line has at least one line voltage, which is stored in a storage unit.

The second load current extracting step S04 is performed to drive the processing unit to extract a second load current 120 of a second logic circuit. The second logic circuit is connected to the power supply voltage to generate the second load current 120.

The limited voltage drop calculating step S06 is performed to drive the processing unit to set a speed proportional value 130 and store the speed proportional value 130 to a storage unit. The processing unit performs a voltage calculating procedure on the speed proportional value 130, the first load current 110 and the second load current 120 to calculate a limited voltage drop 140 between the at least one power switch transistor and the first logic circuit.

The standard supply current calculating step S08 is performed to drive the processing unit to calculate a standard supply current 150 of the at least one power switch transistor according to the limited voltage drop 140.

The simulated supply current calculating step S10 is performed to drive the processing unit to perform a current calculating procedure on the standard supply current 150, the limited voltage drop 140 and the at least one line voltage to calculate a simulated supply current 160 of the at least one power switch transistor.

The size setting step S12 is performed to drive the processing unit to compare the first load current 110 with the simulated supply current 160 to calculate a size parameter 170, and then set a size of the at least one power switch transistor according to the size parameter 170.

Therefore, the user an request the speed requirements of the pluralities of the first logic circuits corresponding to the different specifications to set the speed proportional value 130, and calculate the size parameter 170 by using the size setting method 100 for the at least one power switch transistor of the present disclosure. The user can configure the power switch transistor having the appropriate size to the first logic circuit so as to minimize area loss and standby power consumption. The size setting method 100 for the at least one power switch transistor of the present disclosure is described in more detail with the drawings and the embodiments below.

Figure 2:
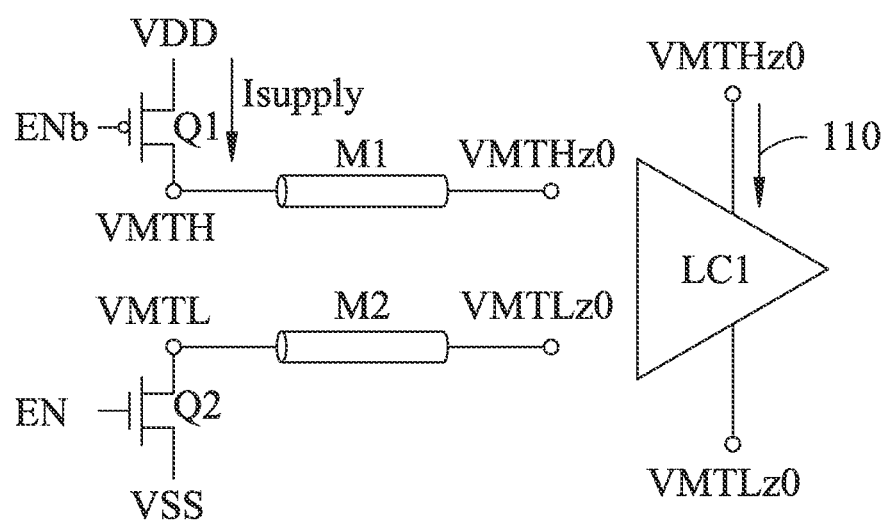
FIG. 2 shows a schematic circuit diagrams of a first logic circuit, two power switch transistors and two power lines in a first load current extracting step of the size setting method for the at least one power switch transistor of FIG. 1.
Figure 3:
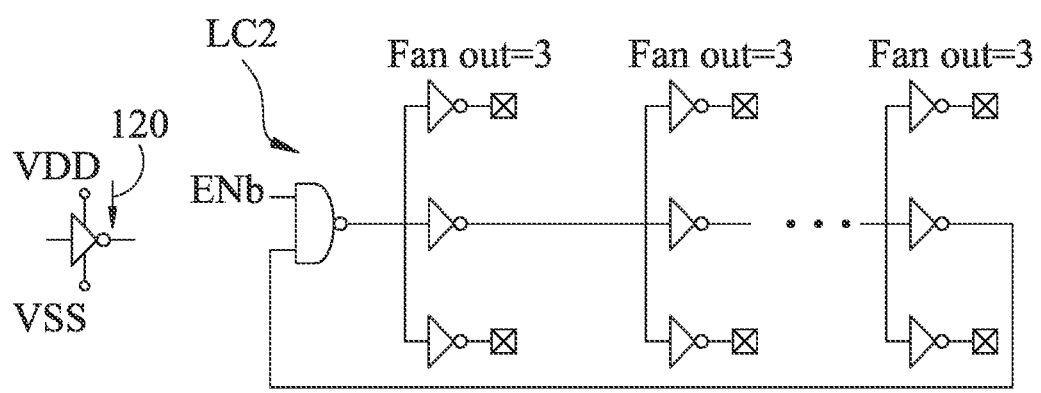
FIG. 3 shows a schematic circuit diagram of a second logic circuit in a second load current extracting step of the size setting method for the at least one power switch transistor of FIG. 1.

Please refer to FIGS. 1, 2 and 3. FIG. 2 shows a schematic circuit diagram of a first logic circuit LC1, two power switch transistors Q1, Q2 and two power lines M1, M2 in the first load current extracting step S02 of the size setting method 100 for the at least one power switch transistor of FIG. 1. FIG. 3 shows a schematic circuit diagram of a second logic circuit LC2 in the second load current extracting step S04 of the size setting method 100 for the at least one power switch transistor of FIG. 1. It should be noted that a structure of the first logic circuit LC1 in the first embodiment is the same as the second logic circuit LC2, that is, the first logic circuit LC1 and the second logic circuit LC2 are the same logic circuit; in other words, the second logic circuit LC2 in FIG. 3 is an internal circuit diagram of the first logic circuit LC1 in FIG. 2.

As shown in FIG. 2, the first load current extracting step S02 can be performed to connect a power supply voltage VDD to a first power domain VMTHz0 of the first logic circuit LC1 via the power switch transistor Q1 and the power line M1, so that a plurality of transistors in the first logic circuit LC1 (i.e., corresponding to a plurality of transistors in the second logic circuit LC2 in FIG. 3) are operated in a saturation region and generate the first load current 110. In addition, the first load current extracting step S02 can also be performed to connect another power supply voltage VSS to a second power supply domain VMTLz0 of the first logic circuit LC1 via the power switch transistor Q2 and the power line M2, so that the aforementioned transistors are operated in the saturation region and generate another first load current (not shown). In general, a power supply in a logic circuit can be divided into multiple independent blocks, which are called power domains. The first power domain VMTHz0 of the present disclosure is a high-voltage power domain in the first logic circuit LC1; on the contrary, the second power domain VMTLz0 is a low-voltage power domain in the first logic circuit LC1.

Further, both of the power switch transistors Q1, Q2 of the first embodiment can be a Multi-Threshold CMOS (MTCMOS). Specifically, the power switch transistor Q1 is a PMOS transistor, and the power switch transistor Q2 is an NMOS transistor. A gate terminal of the power switch transistor Q1 is electrically connected to an inverted enable signal ENb, which is configured to control the opening and closing of the power switch transistor Q1. A source terminal of the power switch transistor Q1 is electrically connected to the power supply voltage VDD. A terminal voltage between a drain terminal of the power switch transistor Q1 and the power line M1 is represented as VMTH. Similarly, a gate terminal of the power switch transistor Q2 is electrically connected to an enable signal EN, which is configured to control the opening and closing of the power switch transistor Q2. A source terminal of the power switch transistor Q2 is electrically connected to the power supply voltage VSS. A terminal voltage between a drain terminal of the power switch transistor Q2 and the power line M2 is represented as VMTL, and the power line M1 and the power line M2 are the same line having the same line voltage.

As shown in FIG. 3, the second logic circuit LC2 is a 23-stage ring oscillator, which is composed of 23 sets of inverters connected in series. In the first embodiment, the second logic circuit LC2 includes a NAND gate and 22 sets of inverters. A fan out of the second logic circuit LC2 is 3, and each of the inverters in the second logic circuit LC2 can include a plurality of transistors (not shown). In detail, the second load current extracting step S04 can be performed to connect the power supply voltage VDD to a first power supply domain (i.e., a high-voltage power supply domain connected to each of the inverters) and a second power supply domain (i.e., a low-voltage power domain connected to each of the inverters) of the second logic circuit LC2, so that the transistors in the second logic circuit LC2 are operated in a saturation region and generate the second load current 120.

A response speed of the first logic circuit LC1 connected to the power switch transistor Q1 is lower than a response speed of the second logic circuit LC2 not connected to any power switch. In response to determining that the first load current 110 is greater than a supply current Isupply flowing through the power switch transistor Q1 (as shown in FIG. 2), a charging time of the first logic circuit LC1 increases. If the power supply range is farther (i.e., the power line M1 is longer), a resistance value of the power line M1 must be considered. In detail, the present disclosure wants to ensure that the response speed of the first logic circuit LC1 can only be slightly lower than the response speed of the second logic circuit LC2, so the speed proportional value 130 can be set by the processing unit, and the voltage drop caused by the power line M1 is limited via the speed proportional value 130, so that the high response speed of the first logic circuit LC1 connected to the power switch transistor Q1 is maintained.

In the limited voltage drop calculating step S06, the voltage calculating procedure can include the speed proportional value 130, the first load current 110, the second load current 120, the power supply voltage VDD, a threshold voltage of the power switch transistor Q1 and a terminal voltage between the power line M1 and the first logic circuit LC1 (i.e., the voltage value supplied to the first power domain VMTHz0). The speed proportional value 130 is represented as S, the first load current 110 is represented as $I_{MTCOMS}$, the second load current 120 is represented as $I_{non\_MTCOMS}$, the power supply voltage VDD is represented as $V_{DD}$, the threshold voltage of the power switch transistor Q1 is represented as $V_{th}$, the terminal voltage is represented as $V_{QL}$, and the speed proportional value 130 conforms to an equation (1):

$$1 - \frac{I_{non\_MTCOMS}}{I_{MTCOMS}} = 1 - \frac{(V_{DD}-V_{th})^2}{(V_{QL}-V_{th})^2} \le S. \quad (1)$$

In detail, since both of the transistors in the first logic circuit LC1 and the transistors in the second logic circuit LC2 are operated in the saturation region, both of the first load current 110 and the second load current 120 belong to a saturation region current. The first load current 110 conforms to an equation (2) according to the conventional saturation region equation, and the second load current 120 conforms to an equation (3) according to the conventional saturation region equation:

$$I_{MTCOMS}=K(V_{QL}-V_{th})^2 \quad (2);$$

$$I_{non\_MTCOMS}=K(V_{DD}-V_{th})^2 \quad (3).$$

K is a process transconductance parameter, which cancels out in the equation (1). In addition, the terminal voltage between the power line M1 and the first logic circuit LC1 conforms to an equation (4):

$$\begin{cases} V_{DD} = I_{MTCOMS} * R_{M1} + V_{QL} \\ V_{QL} = V_{DD} - I_{MTCOMS} * R_{M1} \end{cases} \quad (4)$$

$R_{M1}$ is the resistance value of the power line M1. Generally speaking, in response to determining that the loads (not shown) connected to a rear end of the first logic circuit LC1 are the same, the first load current 110 of the first logic circuit LC1 is inversely proportional to the charging times corresponding to the loads. The present disclosure defines a speed parameter corresponding to the first logic circuit LC1 to be proportional to the charging time, so the aforementioned speed parameter is inversely proportional to the first load current 110. Then, the processing unit limits a difference generated from the terminal voltage between the power line M1 and the first logic circuit LC1 and the power supply voltage VDD to be the limited voltage drop 140 according to the speed proportional value 130 in the equation (1).

For example, the power supply voltage VDD of the first embodiment is equal to 1.1 volts ($V_{DD}$=1.1 V), the threshold voltage of the power switch transistor Q1 is equal to 0.25 volts ($V_{th}$=0.25 V), and the speed proportional value 130 is set to 5% (S=0.05). The processing unit substitutes the above parameters into the equation (1), the equation (1) can be deduced that the terminal voltage between the power line M1 and the first logic circuit LC1 can only be smaller than the power supply voltage VDD by 21 mV, and the 21 mV is the limited voltage drop 140. In other embodiments, the user can request the speed requirements of the pluralities of first logic circuits corresponding to the different specifications to set the speed proportional value, and the present disclosure is not limited thereto.

Moreover, the standard supply current calculating step 308 of the present disclosure can include a presetting sub-step S081 and an estimating sub-step S082. The presetting sub-step S081 is performed to drive the processing unit to preset the limited voltage drop 140 as a drain-source voltage of the power switch transistor Q1, so that the power switch transistor Q1 is operated in a linear region. The estimating sub-step S082 is performed to drive the processing unit to estimate the standard supply current 150 according to the drain-source voltage of the power switch transistor Q1. Furthermore, the supply current Isupply of the power switch transistor Q1 is in the linear region, because the power supply voltage VDD minus the terminal voltage VMTH between the source terminal of the power switch transistor Q1 and the power line M1 is less than the power supply voltage VDD minus the threshold voltage of the power switch transistor Q1. If the length of the power line M1 is very short and the resistance value of the power line M1 is ignored, the processing unit sets the limited voltage drop 140 (i.e., 21 mV) as the drain-source voltage of the power switch transistor Q1 and substitutes the limited voltage drop 140 into the conventional linear region equation, and the standard supply current 150 conforms to an equation (5):

$$I_D = -\mu_p C_{ox} \frac{W}{L}\left((V_{GS} - V_{th})V_{DS} - \frac{V_{DS}^2}{2}\right). \quad (5)$$

$I_D$ is the standard supply current 150, $V_{DS}$ is the limited voltage drop 140 ($V_{DS}$=21 mV), $V_{GS}$ is a gate-source voltage of the power switch transistor Q1 ($V_{GS}$=VDD−VSS=1.1−0=1.1 V), $\mu_p$ is a carrier mobility in the linear region, W is a channel width of the power switch transistor Q1 (W=3.6 μm), L is a channel length of the power switch transistor Q1 (L=0.08 μm), $C_{ox}$ is an unit capacity of a gate oxide layer, $V_{th}$ is the threshold voltage of the power switch transistor Q1 ($V_{th}$=0.25 V). Both of the carrier mobility $\mu_p$ in the linear region and the unit capacity $C_{ox}$ of the gate oxide layer are parameters determined by the process of the transistor. The processing unit can calculate a result that the standard supply current 150 is equal to 20 microamps ($I_D$=20 μA) by substituting the above parameters into the equation (5). The standard supply current 150 represents that when a drain current of the power switch transistor Q1 is 20 microamps, the response speed of the first logic circuit LC1 is only less than 5% relative to the response speed of the second logic circuit LC2.

On the other hand, if the power supply range between the power switch transistor Q1 and the first logic circuit LC1 is far, the resistance value of the power line M1 needs to be considered, and a voltage across the power line M1 needs to be calculated. In the simulated supply current calculating step S10, the processing unit performs the current calculating procedure on the standard supply current 150, the limited voltage drop 140 and the line voltage across the power line M1 to calculate the simulated supply current 160 of the power switch transistor Q1.

Furthermore, the current calculating procedure can include the simulated supply current 160, the standard supply current 150, the limited voltage drop 140 and the line voltage across the power line M1. The simulated supply current 160 is represented as $I_{supplyR\_unit}$, the standard supply current 150 is represented as $I_{supply\_unit}$, the limited voltage drop 140 is represented as $V_{drop}$, the line voltage across the power line M1 is represented as $V_{line}$, and the simulated supply current 160 conforms to an equation (6):

$$I_{supplyR\_unit} = I_{supply\_unit} * \left[\frac{(V_{drop} - V_{line})}{V_{drop}}\right]. \quad (6)$$

Wherein $V_{line}=I_{MTCOMS}*R_{M1}$, $I_{MTCOMS}$=0.5 mA, $R_{M1}$ is the resistance value of the power line M1, $R_{M1}$=20 ohm (a line length of the power line M1 is 100 μm), $V_{drop}$=21 mV, and $I_{supply\_unit}$=20 μA. The processing unit can calculate the simulated supply current 160 ($I_{supplyR\_unit}$=20*0.52381) by substituting the above parameters into the equation (6).

Then, the size setting step S12 is performed. The processing unit compares the first load current 110 with the simulated supply current 160 to calculate the size parameter 170, and then sets the size of the power switch transistor Q1 according to the size parameter 170. In detail, the processing unit divides the first load current 110 by the simulated supply current 160 to generate the size parameter 170, and then multiplies the size parameter 170 by the channel length and the channel width of the power switch transistor Q1 to calculate the size of the power switch transistor Q1, which conforms to two following equations (7) and (8):

$$\text{Multi} = \frac{I_{MTOCMS}}{I_{supplyR\_unit}}; \quad (7)$$

$$\begin{cases} S_L = \text{Multi} * L \\ S_W = \text{Multi} * W \end{cases}. \quad (8)$$

Multi is the size parameter 170, $I_{MTCOMS}$ is the first load current 110, $I_{supplyR\_unit}$ is the simulated supply current 160, a length dimension of the power switch transistor Q1 is represented as $S_L$, and a width dimension of the power switching transistor Q1 is represented as $S_W$, L is the channel length of the power switch transistor Q1, and W is the channel width of the power switch transistor Q1.

Table 1 lists the size parameters 170 of the present disclosure in different specifications, which correspond to the line lengths and the resistance values of the power lines M1 (i.e., different power supply ranges) and the first load currents 110 of the first logic circuits LC1 in different specifications. It should be noted that Table 1 is mainly for the case where the speed proportional value 130 is 5%, and the present disclosure is not limited thereto.

TABLE 1

| | the size parameters 170 (Multi) | | | | | | |
|---|---|---|---|---|---|---|---|
| $I_{MTCOMS}$ (μA) | 69 | 140 | 228 | 283 | 422 | 562 | 840 |
| 1 μm (0.2 ohm) | 4 | 7 | 12 | 15 | 22 | 30 | 44 |
| 10 μm (2 ohm) | 4 | 7 | 13 | 15 | 23 | 33 | 48 |
| 50 μm (10 ohm) | 4 | 8 | 13 | 17 | 28 | 42 | 74 |
| 100 μm (20 ohm) | 4 | 9 | 15 | 20 | 36 | | |

In Table 1, in response to determining that the length of the power line M1 is 10 μm and the first load current 110 is 840 μA, the user can configure the size parameter 170 (Multi=48) to set the size of the power switch transistor Q1, and so on. Therefore, the user can set the size of the power switch transistor Q1 to meet the speed proportional value 130 by using the size setting method 100 for the at least one power switch transistor of the present disclosure, and ensure that various logic circuits still maintain high-speed transmission.

Figure 4:
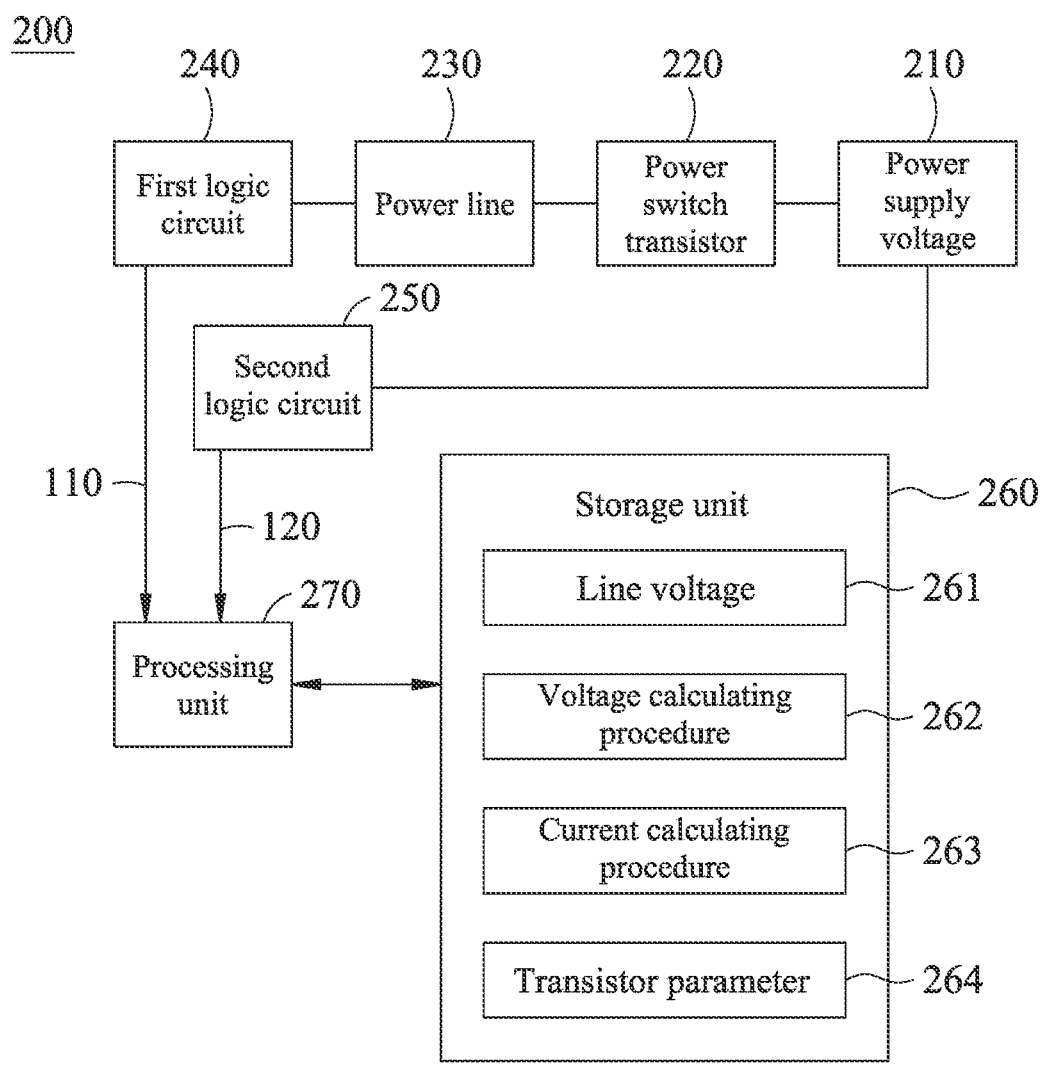
FIG. 4 shows a block diagram of a size setting system for at least one power switch transistor according to a second embodiment of the present disclosure.

Please refer to FIGS. 1 to 4. FIG. 4 shows a block diagram of a size setting system 200 for at least one power switch transistor according to a second embodiment of the present disclosure. As shown in FIG. 4, the size setting system 200 for at least one power switch transistor includes a power supply voltage 210, a power switch transistor 220, a power line 230, a first logic circuit 240, a second logic circuit 250, a storage unit 260 and a processing unit 270. The power switch transistor 220 is electrically connected to the power supply voltage 210. The power line 230 is electrically connected to the power switch transistor 220, and has a line voltage 261. The first logic circuit 240 is electrically connected to the power line 230, and generates a first load current 110. The second logic circuit 250 is electrically connected to the power supply voltage 210, and generates a second load current 120. The structure of the first logic circuit 240 is the same as the second logic circuit 250. The storage unit 260 is configured to access the line voltage 261, a voltage calculating procedure 262, a current calculating procedure 263 and a transistor parameter 264 of the power switch transistor 220. The processing unit 270 is signally connected to the storage unit 260. In addition, the processing unit 270 extracts a peak current of the first load current 110 and a peak current of the second load current 120, and is configured to implement the size setting method 100 for the at least one power switch transistor. The processing unit 270 can be a Digital Signal Processor (DSP), a Micro Processing Unit (MPU), a Central Processing Unit (CPU) or other electronic processors, but the present disclosure is not limited thereto.

Therefore, the size setting system 200 for at least one power switch transistor of the present disclosure utilizes the processing unit 270 to calculate the limited voltage drop 140 according to the first load current 110 and the second load current 120, and set the size of the power switch transistor 220 that can satisfy the speed proportional value 130. The size setting system 200 for at least one power switch transistor of the present can ensure that the first logic circuit 240 connected to the power switch transistor 220 still maintains high-speed transmission.

In summary, the present disclosure has the following advantages. First, it is favorable to avoid configuring oversized power switch transistors in the logic circuits, thereby reducing circuit costs. Second, it is favorable to ensure that the logic circuits with the power switch transistors still have high-speed transmission. Third, it can reduce the user's layout time for the size configuration of the power switch transistor in the product development, thereby speeding up the development process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A size setting method for at least one power switch transistor, comprising:
   performing a first load current extracting step to drive a processing unit to extract a first load current of a first logic circuit, wherein the first logic circuit is connected to a power supply voltage via the at least one power switch transistor and at least one power line to generate the first load current, and the at least one power line has at least one line voltage;
   performing a second load current extracting step to drive the processing unit to extract a second load current of a second logic circuit, wherein the second logic circuit is connected to the power supply voltage to generate the second load current;
   performing a limited voltage drop calculating step to drive the processing unit to set a speed proportional value and store the speed proportional value to a storage unit, wherein the processing unit performs a voltage calculating procedure on the speed proportional value, the first load current and the second load current to calculate a limited voltage drop between the at least one power switch transistor and the first logic circuit;
   performing a standard supply current calculating step to drive the processing unit to calculate a standard supply current of the at least one power switch transistor according to the limited voltage drop;
   performing a simulated supply current calculating step to drive the processing unit to perform a current calculating procedure on the standard supply current, the limited voltage drop and the at least one line voltage to calculate a simulated supply current of the at least one power switch transistor; and
   performing a size setting step to drive the processing unit to compare the first load current with the simulated supply current to calculate a size parameter, and then set a size of the at least one power switch transistor according to the size parameter;
   wherein the voltage calculating procedure comprises the speed proportional value, the first load current, the second load current, the power supply voltage, a threshold voltage and a terminal voltage between the at least one power line and the first logic circuit, the speed proportional value is represented as S, the first load current is represented as $I_{MTCOMS}$, the second load current is represented as $I_{non\_MTCOMS}$, the power supply voltage is represented as $V_{DD}$, the threshold voltage is represented as $V_{th}$, and the terminal voltage is represented as $V_{QL}$ and conforms to a following equation:

$$1 - \frac{I_{non\_MTCOMS}}{I_{MTCOMS}} = 1 - \frac{(V_{DD} - V_{th})^2}{(V_{QL} - V_{th})^2} \leq S;$$

wherein the processing unit limits a difference between the terminal voltage and the power supply voltage to be the limited voltage drop according to the speed proportional value.

2. The size setting method for the at least one power switch transistor of claim 1, wherein a structure of the first logic circuit is the same as a structure of the second logic circuit.

3. The size setting method for the at least one power switch transistor of claim 1, wherein the first logic circuit comprises a plurality of transistors, and the first load current extracting step comprises:
   connecting the power supply voltage to a first power domain and a second power domain of the first logic circuit via the at least one power switch transistor and the at least one power line so as to enable the transistors to be operated in a saturation region and generate the first load current.

4. The size setting method for the at least one power switch transistor of claim 1, wherein the second logic circuit comprises a plurality of transistors, and the second load current extracting step comprises:
connecting another power supply voltage to a first power supply domain and a second power supply domain of the second logic circuit so as to enable the transistors to be operated in a saturation region and generate the second load current.

5. The size setting method for the at least one power switch transistor of claim 1, wherein the standard supply current calculating step comprises:
performing a presetting sub-step to drive the processing unit to preset the limited voltage drop as a drain-source voltage of the at least one power switch transistor so as to enable the at least one power switch transistor to be operated in a linear region; and
performing an estimating sub-step to drive the processing unit to estimate the standard supply current according to the drain-source voltage.

6. The size setting method for the at least one power switch transistor of claim 1, wherein the current calculating procedure comprises the simulated supply current, the standard supply current, the limited voltage drop and the at least one line voltage, the simulated supply current is represented as $I_{supplyR\_unit}$, the standard supply current is represented as $I_{supply\_unit}$, the limited voltage drop is represented as $V_{drop}$, the at least one line voltage is represented as $V_{line}$ and conforms to a following equation:

$$I_{supplyR\_unit} = I_{supply\_unit} * \left[\frac{(V_{drop} - V_{line})}{V_{drop}}\right].$$

7. The size setting method for the at least one power switch transistor of claim 1, wherein the at least one power switch transistor is a Multi-Threshold CMOS (MTCMOS).

8. A size setting system for at least one power switch transistor, comprising:
a power supply voltage;
the at least one power switch transistor connected to the power supply voltage;
at least one power line connected to the at least one power switch transistor and having at least one line voltage;
a first logic circuit connected to the at least one power line and generating a first load current;
a second logic circuit connected to the power supply voltage and generating a second load current;
a storage unit configured to access the at least one line voltage, a voltage calculating procedure and a current calculating procedure; and
a processing unit signally connected to the storage unit, wherein the processing unit is configured to implement a size setting method for the at least one power switch transistor comprising:
performing a first load current extracting step to extract the first load current;
performing a second load current extracting step to extract the second load current;
performing a limited voltage drop calculating step to set a speed proportional value and store the speed proportional value to the storage unit, and then perform the voltage calculating procedure on the speed proportional value, the first load current and the second load current to calculate a limited voltage drop between the at least one power switch transistor and the first logic circuit;
performing a standard supply current calculating step to calculate a standard supply current of the at least one power switch transistor according to the limited voltage drop;
performing a simulated supply current calculating step to perform the current calculating procedure on the standard supply current, the limited voltage drop and the at least one line voltage to calculate a simulated supply current of the at least one power switch transistor; and
performing a size setting step to compare the first load current with the simulated supply current to calculate a size parameter, and then set a size of the at least one power switch transistor according to the size parameter;
wherein the voltage calculating procedure comprises the speed proportional value, the first load current, the second load current, the power supply voltage, a threshold voltage and a terminal voltage between the at least one power line and the first logic circuit, the speed proportional value is represented as S, the first load current is represented as $I_{MTCOMS}$, the second load current is represented as $I_{non\_MTCOMS}$, the power supply voltage is represented as $V_{DD}$, the threshold voltage is represented as $V_{th}$, and the terminal voltage is represented as $V_{QL}$ and conforms to a following equation:

$$1 - \frac{I_{non\_MTCOMS}}{I_{MTCOMS}} = 1 - \frac{(V_{DD} - V_{th})^2}{(V_{QL} - V_{th})^2} \leq S;$$

wherein the processing unit limits a difference between the terminal voltage and the power supply voltage to be the limited voltage drop according to the speed proportional value.

9. The size setting system for the at least one power switch transistor of claim 8, wherein a structure of the first logic circuit is the same as a structure of the second logic circuit.

10. The size setting system for the at least one power switch transistor of claim 8, wherein the first logic circuit comprises a plurality of transistors, and the first load current extracting step comprises:
connecting the power supply voltage to a first power domain and a second power domain of the first logic circuit via the at least one power switch transistor and the at least one power line so as to enable the transistors to be operated in a saturation region and generate the first load current.

11. The size setting system for the at least one power switch transistor of claim 8, wherein the second logic circuit comprises a plurality of transistors, and the second load current extracting step comprises:
connecting another power supply voltage to a first power supply domain and a second power supply domain of the second logic circuit so as to enable the transistors to be operated in a saturation region and generate the second load current.

12. The size setting system for the at least one power switch transistor of claim 8, wherein the standard supply current calculating step comprises:
performing a presetting sub-step to drive the processing unit to preset the limited voltage drop as a drain-source voltage of the at least one power switch transistor so as to enable the at least one power switch transistor to be operated in a linear region; and performing an estimating sub-step to drive the processing unit to estimate the standard supply current according to the drain-source voltage.

13. The size setting system for the at least one power switch transistor of claim 8, wherein the current calculating procedure comprises the simulated supply current, the standard supply current, the limited voltage drop and the at least one line voltage, the simulated supply current is represented as $I_{supplyR\_unit}$, the standard supply current is represented as $I_{supply\_unit}$, the limited voltage drop is represented as $V_{drop}$, the at least one line voltage is represented as $V_{line}$ and conforms to a following equation:

$$I_{supplyR\_unit} = I_{supply\_unit} * \left[\frac{(V_{drop} - V_{line})}{V_{drop}}\right].$$

14. The size setting system for the at least one power switch transistor of claim 8, wherein the at least one power switch transistor is a Multi-Threshold CMOS (MTCMOS).

* * * * *